United States Patent
Ichikawa

(10) Patent No.: US 9,553,241 B2
(45) Date of Patent: Jan. 24, 2017

(54) SEMICONDUCTOR LIGHT EMITTING DEVICE AND METHOD FOR PRODUCING THE SAME

(71) Applicant: NICHIA CORPORATION, Anan-shi (JP)

(72) Inventor: Masatsugu Ichikawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/719,838

(22) Filed: May 22, 2015

(65) Prior Publication Data

US 2015/0340567 A1 Nov. 26, 2015

(30) Foreign Application Priority Data

May 25, 2014 (JP) .................................. 2014-107643

(51) Int. Cl.
| | | |
|---|---|---|
| H01L 33/00 | (2010.01) | |
| H01L 21/00 | (2006.01) | |
| H01L 33/46 | (2010.01) | |
| H01L 33/62 | (2010.01) | |
| H01L 33/50 | (2010.01) | |
| H01L 33/58 | (2010.01) | |

(52) U.S. Cl.
CPC .............. *H01L 33/46* (2013.01); *H01L 33/62* (2013.01); *H01L 33/505* (2013.01); *H01L 33/58* (2013.01); *H01L 2224/16225* (2013.01); *H01L 2224/32225* (2013.01); *H01L 2224/73204* (2013.01); *H01L 2933/0025* (2013.01)

(58) Field of Classification Search
CPC ....................................................... H01L 33/46
USPC ................................................. 257/98; 438/29
See application file for complete search history.

(56) References Cited

U.S. PATENT DOCUMENTS

| | | | |
|---|---|---|---|
| 2006/0065901 A1 | 3/2006 | Aoyagi et al. | |
| 2008/0048206 A1 | 2/2008 | Lee et al. | |
| 2009/0200568 A1 | 8/2009 | Horie | |

(Continued)

FOREIGN PATENT DOCUMENTS

| | | |
|---|---|---|
| JP | 2004-247654 | 9/2004 |
| JP | 2006-100500 | 4/2006 |

(Continued)

*Primary Examiner* — Matthew Landau
*Assistant Examiner* — Igwe U Anya
(74) *Attorney, Agent, or Firm* — Mori & Ward, LLP

(57) ABSTRACT

A method for producing a semiconductor light emitting device includes a light-emitting-element provision step, a light-emitting-element placement step, and a light-reflection-layer coating step, in this order. In the light-emitting-element provision step, a light emitting element is prepared which includes a semiconductor layer structure on the lower-surface side of a substrate. In the light-emitting-element placement step, the light emitting element is placed on or above a supporting member from the semiconductor layer structure side. In the light-reflection-layer coating step, the surfaces of the substrate and the semiconductor layer structure is coated with a light reflection layer by using atomic layer deposition so as to expose at least a part of the upper surface or a part of side surface of the substrate as a light-extracting region. The intended functioning of the light reflection layer can be ensured. The highly reliable light reflection layer can make the device good quality.

18 Claims, 6 Drawing Sheets

(56) References Cited

U.S. PATENT DOCUMENTS

| | | | |
|---|---|---|---|
| 2010/0117111 A1 | 5/2010 | Illek et al. | |
| 2011/0025190 A1 | 2/2011 | Jagt | |
| 2011/0291143 A1* | 12/2011 | Kim | H01L 33/56 257/98 |
| 2012/0032184 A1* | 2/2012 | Tran | H01L 33/0079 257/76 |
| 2012/0049225 A1 | 3/2012 | Wakaki | |
| 2012/0104455 A1* | 5/2012 | Peng | H01L 33/0066 257/103 |
| 2012/0138980 A1* | 6/2012 | Kuo | H01L 31/035227 257/94 |
| 2014/0367717 A1* | 12/2014 | Freund | H01L 33/20 257/98 |
| 2015/0085527 A1* | 3/2015 | Nam | H01L 33/60 362/612 |

FOREIGN PATENT DOCUMENTS

| | | |
|---|---|---|
| JP | 2007-294728 | 11/2007 |
| JP | 2007-324584 | 12/2007 |
| JP | 2008-053685 | 3/2008 |
| JP | 2008-198744 | 8/2008 |
| JP | 2010-525586 | 7/2010 |
| JP | 2011-515846 | 5/2011 |
| JP | 2011-119383 | 6/2011 |
| JP | 2012-069539 | 4/2012 |

\* cited by examiner

SEMICONDUCTOR LIGHT EMITTING DEVICE AND METHOD FOR PRODUCING THE SAME

CROSS-REFERENCE TO RELATED APPLICATIONS

The present application claims priority under 35 U. S. C. §119 to Japanese Patent Application No. 2014-107,643 filed on May 25, 2014. The contents of this application are incorporated herein by references in their entirety.

BACKGROUND OF THE INVENTION

1. Field of the Invention

The present disclosure relates to a semiconductor light emitting device, and a method for producing a semiconductor light emitting device.

2. Description of the Related Art

Semiconductor light emitting elements (hereinafter, referred to as light emitting elements) such as light emitting diode (LED) and laser diode (LD) are typically and widely used for various light sources for backlighting, lighting fixtures, traffic lights, large-size displays, and the like. Light emitting devices that include these light emitting elements are generally provided with a protection layer for protecting the surfaces of the light emitting element, or a reflection layer for directing light toward a desired direction. In the known art, such a layer is formed by sputtering. However, it is difficult to evenly form the layer on the entire surfaces of the light emitting element by sputtering. For example, as the distance from the source of sputtering to the target increases, the thickness of the layer decreases. In other words, the thickness of the layer decreases toward the edges of the light emitting element. As a result, the thickness of the layer varies depending on position. In particular, in the case where a Distributed Bragg Reflector (DBR) is formed as the reflection layer, it is necessary for the layers of the layer to have a precisely adjusted thickness depending on the wavelength of light to be reflected. The reason is that, if the thickness is uneven, it will be difficult to obtain desired light reflection.

See Laid-Open Patent Publication Nos. JP 2012-069,539 A; JP 2011-119,383 A; JP 2010-525,586 A; JP 2008-198,744 A; JP 2008-053,685 A; JP 2007-324,584 A; JP 2007-294,728 A; JP 2006-100,500 A; and JP 2004-247,654 A.

One object of the embodiments of the present invention is to provide a semiconductor light emitting device including a light reflection layer that has a more even thickness, and a method for producing the semiconductor light emitting device.

SUMMARY OF THE INVENTION

A method for producing a semiconductor light emitting device according to an aspect of the present invention includes a light-emitting-element providing step, a light-emitting-element placement step, and a light-reflection-layer coating step, in this order. In the light-emitting-element providing step, a light emitting element is provided which includes a semiconductor layer structure so that a semiconductor layer structure side of the light emitting element faces the supporting member. In the light-emitting-element placement step, the light emitting element is placed on or above a supporting member from the semiconductor layer structure side. In the light-reflection-layer coating step, the surfaces of the substrate and the semiconductor layer structure is coated with a light reflection layer by using atomic layer deposition so as to expose at least a part of the upper surface or any side surface of the substrate as a light-extracting region.

A semiconductor light emitting device according to another aspect of the present invention includes a substrate, a semiconductor layer structure, and a light reflection layer. The semiconductor layer structure is optically coupled to the lower surface of the substrate. The light reflection layer continuously covers the surfaces of the substrate and the semiconductor layer structure so as to expose at least a part of the upper surface or any side surface of the substrate as a light-extracting region. The light reflection layer is constructed of a plurality of layers, and the light reflection layer has a substantially even thickness.

According to a method for producing a semiconductor light emitting device of the embodiment of the present invention, a semiconductor light emitting device can be provided which can ensure the intended functioning of a light reflection layer as its designed feature. Consequently, the highly reliable light reflection layer can provide the semiconductor light emitting device with good quality.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENT(S)

Figure 1:
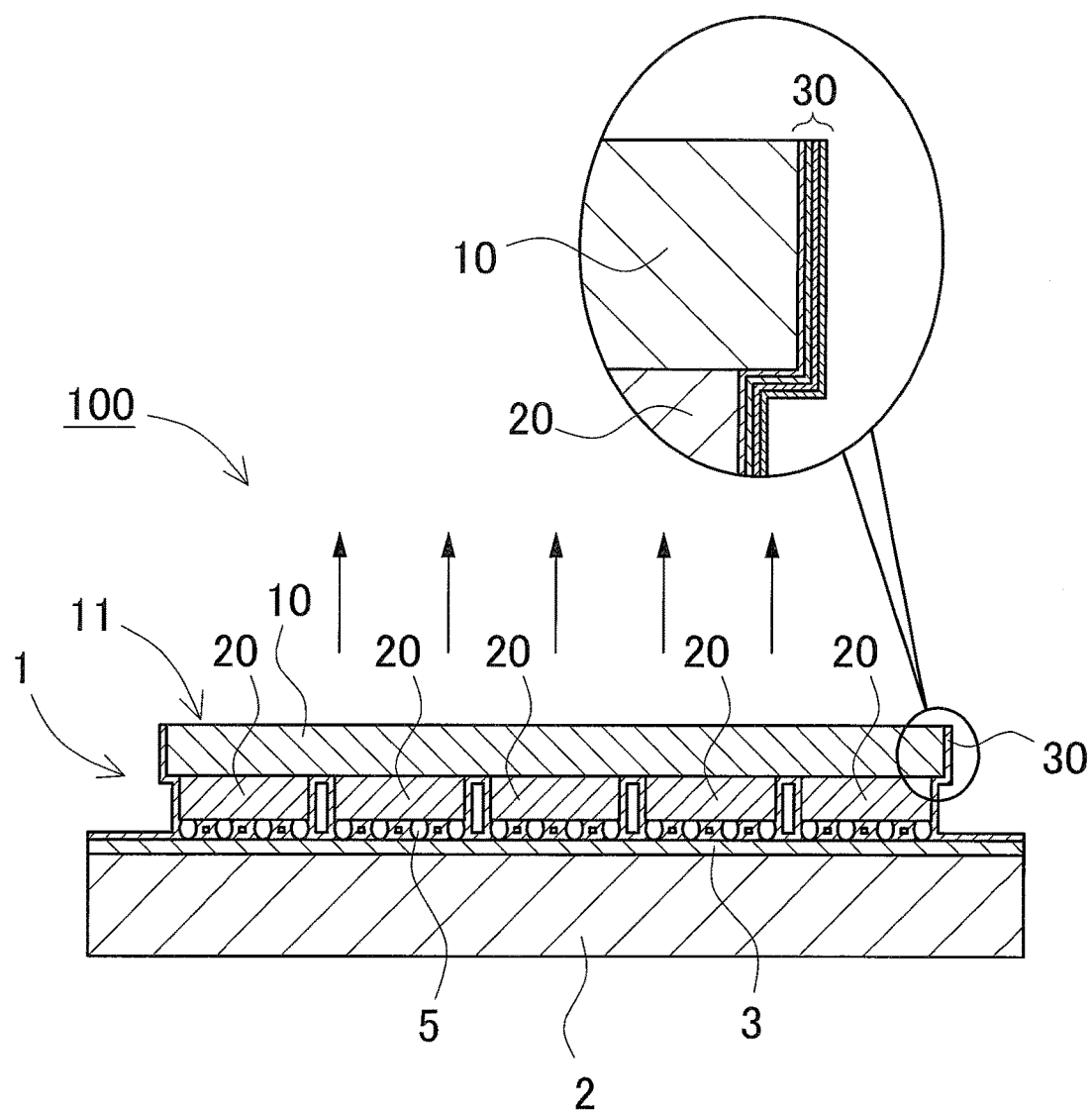
FIG. 1 is a schematic cross-sectional view showing a semiconductor light emitting device according to a first embodiment of the present invention.

The embodiments will now be described with reference to the accompanying drawings, wherein like reference numerals designate corresponding or identical elements throughout the various drawings. It should be appreciated, however, that the embodiments described below are illustrations of a semiconductor light emitting device and a method for producing a semiconductor light emitting device to give a concrete form to technical ideas of the invention, and a semiconductor light emitting device and a method for producing a semiconductor light emitting device of the invention are not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like. Also, the term "on or above" (e.g., on or above a layer) used in the specification is not limited to the arrangement where a member is formed in direct contact with a layer but occasionally includes the arrangement where a member is formed upward with respect to a layer to be spaced away from the member, in other words, the arrangement where a member is interposed between the member and the layer in an inclusive sense.

In a method for producing a semiconductor light emitting device according to one feature, in the light-reflection-layer coating step, a mask can be formed on or above the at least a part of the upper surface or any side surface of a substrate, and the mask can be removed after the surfaces of the substrate and a semiconductor layer structure with a light reflection layer by using atomic layer deposition.

In a method for producing a semiconductor light emitting device according to another feature, in the light-reflection-layer coating step, the light-extracting region can be exposed by dividing the substrate after the surfaces of the substrate and the semiconductor layer structure are coated with the light reflection layer by using atomic layer deposition.

In a method for producing a semiconductor light emitting device according to another feature, in the light-emitting-element placement step, an electrode layer can be provided on or above the upper surface of the supporting member, and the semiconductor layer structure can be electrically connected to the electrode layer. In addition, in the light-reflection-layer coating step, the light reflection layer can cover the upper surface of the supporting member and the surfaces of the substrate and the semiconductor layer.

In a method for producing a semiconductor light emitting device according to another feature, the light reflection layer can be a dielectric multilayer.

In a method for producing a semiconductor light emitting device according to another feature, the light reflection layer can include a dielectric multilayer, and a metal layer that is arranged on or above the dielectric multilayer.

In a method for producing a semiconductor light emitting device according to another feature, the dielectric multilayer can be constructed of at least two types of layers selected from the group consisting of $SiO_2$, $TiO_2$, $Nb_2O_5$, $ZrO_2$, $Al_2O_3$, $Ta_2O_5$, $MgF_2$, AlN, SiON, and SiN.

In a method for producing a semiconductor light emitting device according to another feature, the width of the substrate, which is prepared in the light-emitting-element provision step, can be greater than the width of the semiconductor layer structure of the light emitting element.

In a method for producing a semiconductor light emitting device according to another feature, in the light-emitting-element provision step, the semiconductor layer can be joined to the substrate by direct bonding.

In a method for producing a semiconductor light emitting device according to another feature, in the light-emitting-element provision step, a wavelength conversion member can be provided in the substrate.

In addition, after the semiconductor layer structure is grown on a light-transmissive growth substrate, the growth substrate can be joined to the substrate with the growth substrate facing the substrate.

In a method for producing a semiconductor light emitting device according to another feature, the thickness of the substrate can be greater than the thickness of the growth substrate.

Also, in a semiconductor light emitting device according to one feature, a light-transmissive growth substrate can be provided which is interposed between the substrate and the semiconductor layer structure, and the substrate can contain a wavelength conversion member.

In a semiconductor light emitting device according to another feature, the substrate can be joined to the growth substrate by direct bonding.

In a semiconductor light emitting device according to another feature, the light reflection layer can contain a carbon component.

In a semiconductor light emitting device according to another feature, a supporting member can be provided which includes an electrode layer on or above the upper surface of the supporting member. In addition, the semiconductor layer structure can be electrically connected to the electrode layer. Additionally, the light reflection layer can continuously cover the upper surface of the supporting member together with the surfaces of the substrate and the semiconductor layer structure so as to expose the at least a part of the upper surface of the substrate as a light-extracting region.

In a semiconductor light emitting device according to another feature, the light reflection layer can continuously cover the surfaces of the substrate and the semiconductor layer structure so as to expose the any side surface of the substrate as the light-extracting region, and a light reflective covering member can be provided which covers at least the part of the light reflection layer that covers the side surface of the substrate.

In a semiconductor light emitting device according to another feature, the light reflection layer can be formed by atomic layer deposition.

In a semiconductor light emitting device according to another feature, the light reflection layer can be constructed of a dielectric multilayer.

In a method for producing a semiconductor light emitting device according to another feature, the light reflection layer can include a dielectric multilayer, and a metal layer that is arranged on or above the dielectric multilayer.

First Embodiment

FIG. 1 is a schematic view showing the arrangement of a semiconductor light device 100 according to a first embodiment of the present invention. The illustrated semiconductor light emitting device 100 includes a light emitting element 1, and a supporting member 2. The light emitting element 1 includes a substrate 10, semiconductor layer structures 20, and a light reflection layer 30. The semiconductor layer structures 20 are optically connected to the lower surface of the substrate 10. The light reflection layer 30 covers a part of the surfaces of the semiconductor layer structures 20 and a part of the substrate 10. The supporting member 2 serves as a mount for installation of the semiconductor light emitting device 100. A ceramic substrate, an Al substrate, a glass epoxy substrate, or the like can be used as the supporting member 2. An electrode layer 3 is formed on or above the surface (support-side mounting surface) of the supporting member 2. The light emitting element 1 includes electrodes on the one-side surfaces (element-side mounting surface) of the semiconductor layer structures 20. The light emitting element 1 is mounted on the supporting member 2 by bumps 5, or the like. The electrodes of the light emitting element 1 are electrically connected to the electrode layer 3 of the supporting member 2 through the bumps 5. One surface (the upper surface in FIG. 1) of the substrate 10 serves as a light-extracting region 11 of the light emitting element 1. The light emitted by the semiconductor layer structures 20 is extracted through the light extracting region.

(Semiconductor Layer Structure 20)

Figure 2:
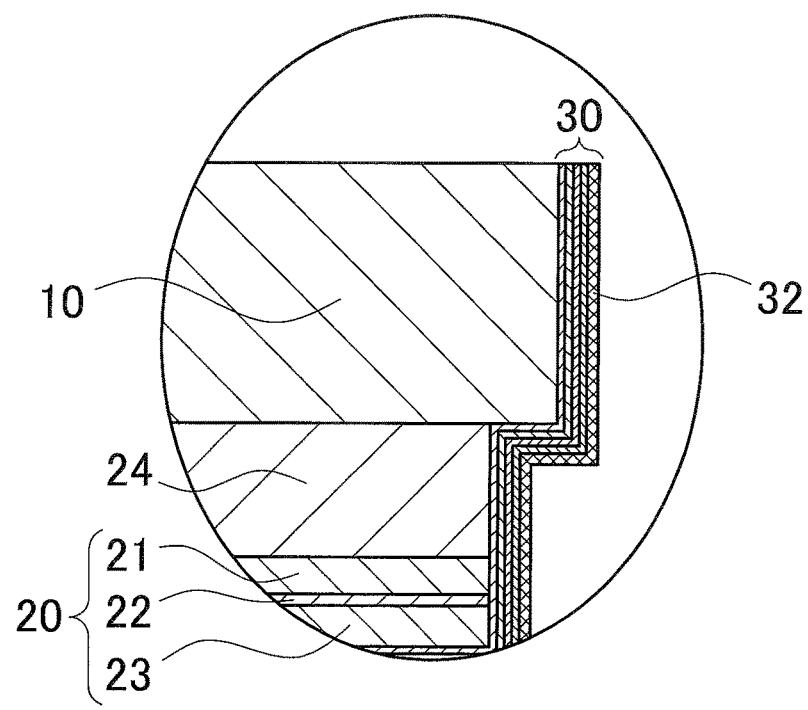
FIG. 2 is an enlarged cross-sectional view showing the feature of a semiconductor light emitting device according to a modified embodiment of the present invention.

The semiconductor layer structure 20 is grown on a light-transmissive growth substrate 24. In this embodiment, the semiconductor layer structure 20 includes an n-type semiconductor layer 21, an active layer 22, and a p-type semiconductor layer 23 that are arranged in this order from the growth substrate 24 side (light-extracting region 11 side), as shown in an enlarged cross-sectional view of FIG. 2 showing the feature of the semiconductor light emitting device. The active layer 22 can emit light of a primary wavelength.

(Substrate 10)

The substrate 10 is joined to the growth substrate 24 so that the semiconductor layer structure 20 is optically connected to the substrate 10. In this embodiment, the substrate 10 serves as a wavelength conversion layer which contains a wavelength conversion material for converting the light with a primary wavelength, which is emitted by the semiconductor layer structure 20, into light with a secondary wavelength different from the first wavelength. In the embodiment shown in FIG. 1, the growth substrates 24 of the light-emitting elements are joined to the single substrate 10 (wavelength conversion layer) with the semiconductor layer structures 20 being aligned in one line. According to this construction, the light emitted by the semiconductor layer structure 20 can be reflected and propagate in the substrate 10. As a result, the semiconductor devices are less likely to be seen as dots. Therefore, this construction can facilitate evenness of the light emitting surface when the light emitting device is used as a planar light source.

Figure 3:
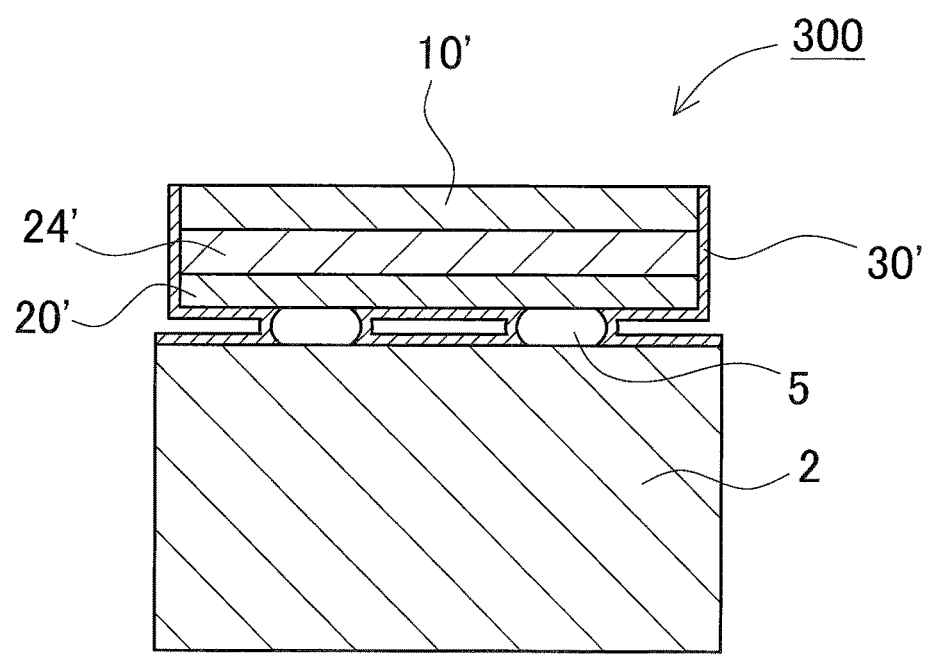
FIG. 3 is a schematic cross-sectional view showing a semiconductor light emitting device according to a modified embodiment of the present invention.

Although it has been described that a plurality of semiconductor layer structures 20 are spaced away from each other and joined to the single substrate 10 in this embodiment, a single semiconductor layer structure can be joined to the substrate 10. For example, in a semiconductor light emitting device 300 according to a modified embodiment shown in FIG. 3, a single semiconductor layer structure 20' is joined to the substrate 10' with the growth substrate 24' being interposed between them. A plurality of the semiconductor layer structures can be respectively disposed on individualized growth substrates. Alternatively, a plurality of the semiconductor layer structures can be disposed on a single growth substrate.

The growth substrates 24 are joined to the substrate 10 by direct bonding. Direct bonding is a bonding process for directly joining substrates to each other without any additional bonding layers. The direct bonding can provide strong bonding. In addition, since adhesives and the like are not required, the number of light reflections between the adhesives and the substrates can be reduced. As a result, the direct bonding can facilitate improvement in light extraction efficiency. Diffusion bonding, room-temperature bonding, anodic bonding, or the like can be used for direct bonding. In particular, surface activated bonding, hydroxyl group bonding, atomic diffusion bonding can be used for room-temperature bonding.

It is preferable that the width of the substrate 10 be greater than the width of the semiconductor layer structures 20. In this case, since the contact width between the light-incident surface of the substrate 10 and the light-extraction surface of the light emitting element 1 can be wide when they are optically coupled to each other, the loss of the light at the bonding boundary can be reduced. Although the substrate is wide, a light reflection layer 30 can be evenly formed by atomic layer deposition (ALD) even on the mounting-side surface (lower surface) of the substrate 10 on which the layer is difficult to be formed by sputtering. Also, since the light-transmissive growth substrate 24 is interposed between the substrate 10 and the semiconductor layer structure 20, even if the thickness of the light emitting element 1 (total thickness of the semiconductor layer structure 20, the growth substrate 24, and the substrate 10) is large, the light reflection layer 30 can be evenly formed on or above the side surfaces of the light emitting element. In particular, when the thickness of the substrate 10 is greater than the growth substrate 24, the light reflection layer 30 can be easily evenly formed on or above the side surface of the substrate 10. The thickness of the substrate 10 can be greater than the thickness of the growth substrate 24. Even if the substrate 10 is thicker than the growth substrate 24, the light reflection layer 30 can be evenly formed on or above the side surfaces of the substrate 10 so that the loss of the light in this area can be reduced.

In the case where the substrate 10 (light-transmissive layer) containing a wavelength conversion member is used, examples of the substrate can be provided by a glass plate that contains a wavelength conversion member; a single crystal material, a polycrystal material, an amorphous material and a ceramic material having a phosphor crystal that is a wavelength conversion member or the phosphor crystal phase; a light-transmissive material (e.g., light-transmissive resin) mixed into or impregnated with a sintered material, an aggregate material, a porous material of phosphor crystal grains and a light-transmissive material that is suitably added to the phosphor crystal grains; a molded member of a light-transmissive member (e.g., light-transmissive resin) that contains phosphor grains; and the like. It should be appreciated that the light-transmissive member is preferably formed of an inorganic material from the viewpoint of heat resistance as compared with organic materials such as resins. Specifically, it is preferable that the substrate containing a wavelength conversion member be formed of a light-transmissive inorganic material containing a phosphor. In particular, in the case where the substrate containing a wavelength conversion member is a sintered material of a phosphor and an inorganic substance (binding material, binder), or a sintered material or crystal of a phosphor, the reliability can be improved. In addition, in the case where a YAG phosphor is used as the wavelength conversion member, the substrate containing a wavelength conversion member is preferably formed of a sintered material of YAG/alumina in which alumina ($Al_2O_3$) is used as a binding material, as well as a single crystal of YAG, and a sintered material of YAG with a high purity from viewpoint of reliability. In the case where the light-transmissive member has a plate shape, the coupling efficiency between the light-transmissive member and the light-extraction surface of the light emitting element 1 can be high, and the light emitting element can be easily aligned substantially in parallel to the main surface of the light-transmissive member. In addition, in the case where the thickness of the light-transmissive member is substantially constant, the wavelength-converted amount of light that passes through the light-transmissive member can be substantially constant so that the color mixing ratio can be stable. Accordingly, the color unevenness of the light emission surface depending on position can be reduced. For this reason, according to this construction, in the case where a plurality of light emitting elements 1 are mounted on a single light-transmissive member, the unevenness due to the positions of the light emitting elements 1 can be small in the distribution of the luminance and chromaticity in the light emitting surface, in other words, the distribution of the luminance and chromaticity in the light emitting surface is substantially fixed, and the light emitting device can emit light at high luminance. The thickness of the light-transmissive member that has the wavelength conversion function preferably within the range between 10 and 500 µm (inclusive), more preferably between 30 and 200 µm (inclusive), in terms of light emission efficiency or chromaticity adjustment. It is preferable that the thickness of the semiconductor layer structure 20 be about 10 µm, and the thickness of the growth substrate 24 preferably within the range between 10 and 400 µm (inclusive).

The wavelength conversion member can suitably used in combination with a blue light emitting element whereby emitting white light. Typical examples of the phosphor used for the wavelength conversion member can be provided by a YAG group phosphor (yttrium aluminum garnet), and a LAG group phosphor (lutetium aluminum garnet), which have garnet structures and are activated by cerium. In particular, in the case where the phosphor is subjected to high intensity light for a long time, the phosphor is preferably formed of $(Re_{1-x}Sm_x)_3(Al_{1-y}Ga_y)_5O_{12}$:Ce (where, $0 \leq x<1$, $0 \leq y \leq 1$, and Re is at least one element selected from the group consisting of Y, Gd, La, and Lu), or the like.

Second Embodiment

Figure 4:
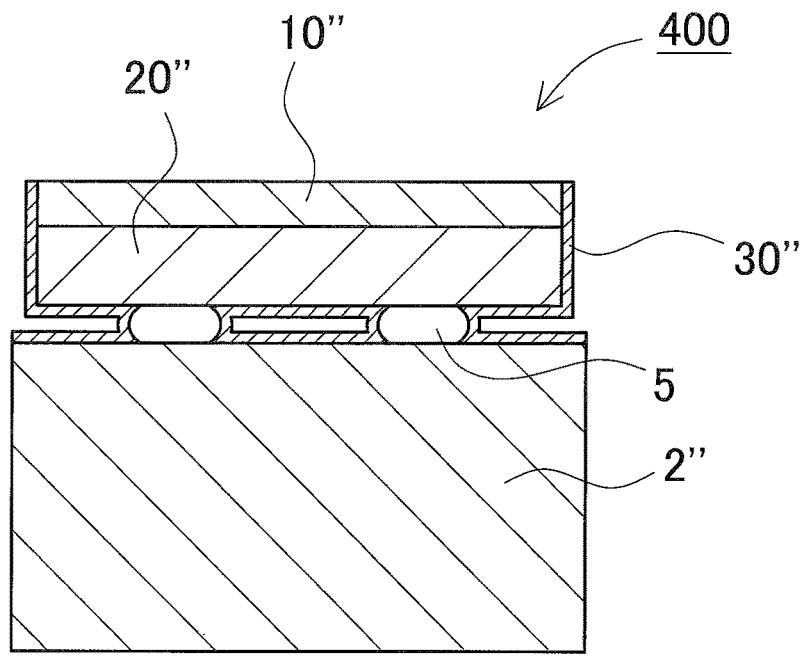
FIG. 4 is a schematic cross-sectional view showing a semiconductor light emitting device according to a second embodiment of the present invention.

Although it has been described that the substrate 10 is a wavelength conversion layer in the foregoing embodiment, the present invention is not limited to the foregoing embodiment. For example, the substrate 10 can be the growth substrate 24. FIG. 4 shows such a light emitting device according to a second embodiment. In a semiconductor light emitting device 400 illustrated in FIG. 4, a substrate 10", which is the growth substrate, is coupled to the upper surface of the semiconductor layer structure 20". In this embodiment, a light-transmissive sapphire substrate, or the like can be used as growth substrate, for example. In the production processes, the light emitting element is produced by epitaxially growing the semiconductor layer structure 20" on or above the sapphire substrate. The light emitting element is mounted on the supporting member 2".

(Light Reflection Layer 30)

The light reflection layer 30 covers the surfaces of the semiconductor layer structure 20 and the substrate 10 with the semiconductor layer structure being joined to the substrate so that a part of substrate 10 is exposed. The exposed part serves as the light-extracting region 11. The light reflection layer 30 continuously covers the upper surface of the supporting member 2, the surfaces of the substrate 10, and the semiconductor layer structure 20 as shown in the schematic cross-sectional view of FIG. 1. Although the entire surface of the upper surface of the substrate 10 serves as the light-extracting region 11 in the embodiment of FIG. 1, the entire surface of the substrate does not necessarily serve as the light-extracting region. For example, a part of the upper surface of the substrate 10 can be covered with the light reflection layer so that the part of the upper surface of the substrate 10 that is not covered by the light reflection layer serves as the light-extracting region.

More specifically, the light reflection layer 30 also covers the side surfaces of the wavelength conversion layer, which is the substrate 10. According to this construction, light that leaks from the end surface of the wavelength conversion layer in conventional semiconductor light emitting devices can be reflected toward the substrate 10 side, and can effectively extracted from the light-extracting region 11. As a result, the extraction efficiency of light can be improved.

The light reflection layer 30 is constructed of a plurality of layers. In this embodiment, a dielectric multilayer (Distributed Bragg Reflector: DBR) is used as the light reflection layer. Although the dielectric multilayer can be constructed of at least two types of layers which are formed of known materials in the art, it is preferable that the dielectric multilayer be constructed of at least two types of layers selected from the group consisting of $SiO_2$, $TiO_2$, $Nb_2O_5$, $ZrO_2$, $Al_2O_3$, $Ta_2O_5$, $MgF_2$, AlN, SiON, and SiN. The thickness of the light reflection layer 30 is substantially constant. In this specification, "the thickness of the light reflection layer is substantially constant" means that the variation of the thickness falls within the range between −10% and 10% of the average thickness (inclusive). Also, in this specification, the light reflection layer refers to a layer that serves to reflect light at not less than 80% of the light having a target wavelength.

(ALD)

The light reflection layer 30 can be suitably formed by ALD. In particular, the wavelength of light to be reflected can be adjusted by the thicknesses of layers of the aforementioned DBR. For this reason, it is important to precisely form the layers having the target thicknesses. In conventional techniques, DBR is typically formed by sputtering. However, a uniform thickness throughout the entire portion of a layer is difficult to obtain by sputtering. Specifically, the thickness of the layer becomes uneven in parts distant from the sputtering source. As a result, the target reflection performance cannot be obtained. Consequently, the performance of the light emitting device will be decreased. In contrast, using ALD, the thickness of the layer can be adjusted so that the thickness is uniform at an atomic level. Accordingly, ALD is ideal for the formation of the light reflection layer since it is important for the formation of the light reflection layer to adjust the thickness of the light reflection layer. In particular, in the case where the light reflection layer is a DBR including a plurality of layers that are deposited on one after another, ALD is suitable for the formation of high quality DBR with reflection performance close to the target value. The reason is that ALD can precisely adjust the thicknesses of the dielectric layers.

In the case where the light reflection layer 30 is formed by ALD, the light reflection layer 30 will contain a carbon component. According to this construction, the thermal conductivity of the light reflection layer 30 can be increased. Therefore, it can be expected that the heat dissipation characteristics are improved.

(Additional Reflection Layer)

In addition, a light reflection layer 30 may include an additional reflection layer on or above the top surface of the DBR. For example, a metal layer 32 that has good light reflection characteristics (e.g., Ag and Al) can be used as the additional reflection layer as shown in the enlarged cross-sectional view of FIG. 2. Since the DBR is formed on or above the surfaces of the light emitting structure, the surfaces are electrically insulated and separated. For this reason, an electrically-conductive layer such as the metal layer 32 can be formed on or above the top surface of the DBR. According to this construction, the metal layer can be arranged without a short circuit.

On the other hand, the metal layer is arranged on the surface side in the upper surface of the supporting member 2. Accordingly, returning light, which travels back to the light emitting device, can be reflected by the metal layer. In particular, in the case where the light reflection layer 30 is constructed of a DBR, the light reflection layer is designed for reflecting light having the target wavelength emitted by the light emitting element 1. For this reason, the light reflection layer of a DBR cannot sufficiently reflect returning light which has a wavelength different from the target wavelength of the light emitting element 1. From this viewpoint, in the case where the metal layer is formed as an additional reflection layer, the light reflection layer can be have the function of reflecting returning light.

As discussed above, since the light reflection layer 30 having a precisely adjusted thickness can be formed on or above the entire side surfaces of the light emitting element, the light reflection layer 30 can effectively reflect light that is emitted by the active layer 22, and is reflected and propagate in the substrate 10. As a result, the light can effectively extract through the light-extracting region 11. Therefore, the light-extraction efficiency can be improved. Specifically, a conventional semiconductor light emitting device 500 includes an additional covering member 540 that is directly arranged on or above the side surfaces of the semiconductor layer structures 520 and the side surfaces of the light-transmissive member 510 whereby preventing leakage of light from the side surfaces of the device 500 as shown in a cross-sectional view of FIG. 5. However, in this construction, since a white organic material (e.g., silicone resin or epoxy resin) is used for the covering member 540, the covering member 540 will deteriorate with time. For this reason, the reliability may decrease (the light-extraction efficiency may decrease) when the light emitting device is used for a long time. In addition, the device will be larger since the covering member 540 is arranged in the periphery of the light-transmissive member 510. Contrary to this, according to the construction of the embodiment, as discussed above, since the leakage of light from the side surface can be prevented by the light reflection layer 30 formed of a thin layer, this covering member 540 can be omitted. Therefore, the semiconductor light emitting device can be smaller. Additionally, since the covering member formed of an organic material can be omitted, the light emitting device can be constructed of inorganic materials. Therefore, the reliability can be improved over the long-term use.

Third Embodiment

A light emitting device according to another embodiment of the present invention can include a light reflective covering member in addition to the light reflection layer 30. In the case where the covering member is provided, the leakage of light from the parts except for the light-extracting region (e.g., the side surfaces) can be further reduced whereby further increasing light confinement. Since the light reflection layer is arranged between the covering member and the light emitting element, the light from the light emitting element is not directly incident upon the covering member. As a result, the deterioration of the covering member can be reduced. This type of light emitting device is shown as a semiconductor light emitting device 600 according to a third embodiment 3 in FIG. 6. In this embodiment, a covering member 40 is additionally formed on or above the side surface of the light reflection layer 30 that is located on or above the side surfaces of the substrate 10 and the semiconductor layer structure 20 (left side in FIG. 6) opposite to the light-extracting region 11 (right side in FIG. 6). According to this construction, the covering member 40 can reflect a light component which passes through the light reflection layer 30.

It has been described that the upper surface of the wavelength conversion layer, which is the substrate 10, serves as the light-extracting region 11 in the embodiment shown in FIG. 1, the present invention is not limited to this construction. For example, one surface of the plurality of the side surface of the substrate can serve as the light-extracting region. Alternatively, a position of a surface of the substrate can serve as the light-extracting region. In this case, the light reflection layer 30 continuously covers the surfaces of the substrate and the semiconductor layer structure so that only the any side surface of the substrate as the light-extracting region is exposed. In the semiconductor light emitting device 600 according to the third embodiment shown in the schematic cross-sectional view of FIG. 6, one of the side surfaces (right side in FIG. 6) of the substrate 10 serves as the light-extracting region 11 as discussed above.

(Production Method of Semiconductor Light Emitting Device)

A production method of the semiconductor light emitting device shown in FIG. 1 is now described. First, a light emitting element that includes semiconductor layer structures 20 on or above the lower-surface side of the substrate 10 is prepared. The semiconductor layer structures 20 are formed by epitaxially growing the required layers such as the n-type semiconductor layer 21, the active layer 22, the p-type semiconductor layer 23, and the like on or above the growth substrate 24 in a predetermined order. In order to improve the light-extraction efficiency, asperities may be formed on the upper surface of the semiconductor layer structure 20 if necessary. In this case, an intermediate layer (e.g., SiON, $Al_2O_3$, $TiO_2$, $Ta_2O_5$, $SiO_2$, SiON, $Nb_2O_5$, or SiN layer) can be formed on the upper surface of the semiconductor layer structure with the asperities so that the upper surface of the intermediate layer as the joint surface of the semiconductor layer structure is flat. After that, the substrate 10 can be directly bonded onto the flat upper surface of the intermediate layer.

Subsequently, the light emitting element is placed so that the semiconductor layer structure 20 faces the supporting member 2, and the light emitting element is mounted on the supporting member. In this process, the electrodes of the semiconductor layer structures 20 are electrically connected to the patterned electrode layer 3 on or above the upper surface of the supporting member 2 by the bumps 5, or the like.

In addition, the light reflection layer 30 is formed by ALD so as to cover the surfaces of the substrate 10 except for the light-extracting region 11, the surfaces of the semiconductor layer structures 20, and the upper surface of the supporting member 2. Accordingly, the substrate surface is partially exposed so that the light-extracting region 11 is provided. In this process, a mask is arranged on a predetermined part which is to be the light-extracting region 11. Then, the light reflection layer is applied with the mask covering the predetermined part. After that the mask is removed. According to the above processes, the semiconductor light emitting device can be produced which includes the light reflection layer 30 covering the surfaces of the substrate 10 and the semiconductor layer structures 20 as well as the upper surface of the supporting member 2.

Figure 6:
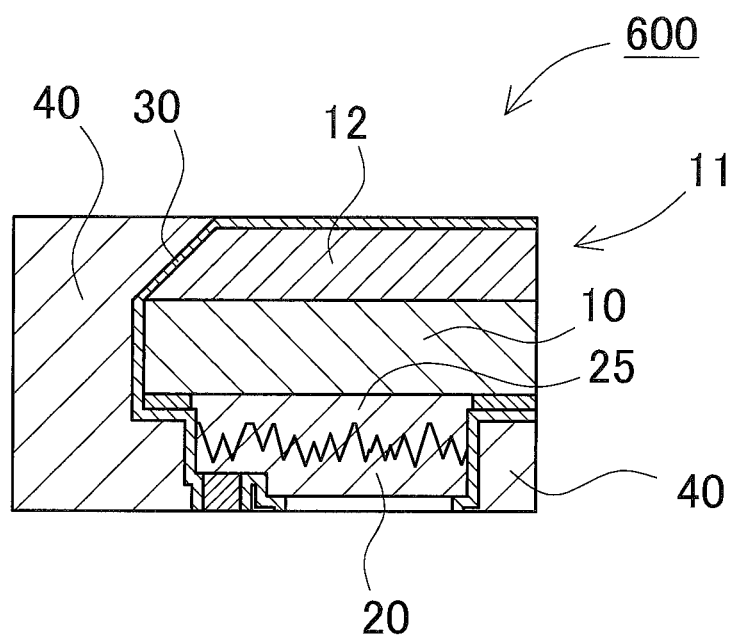
FIG. 6 is a cross-sectional view showing a semiconductor light emitting device according to a third embodiment of the present invention.

A production method of the semiconductor light emitting device shown in FIG. 6 is now described with reference to FIGS. 7A to 7D. First, a light emitting element 1' is prepared which includes a plurality of semiconductor layer structures 20 that are joined to the lower surface of the substrate 10. The substrate includes a light guiding member 12 (e.g., glass) on the upper surface side of the substrate. An intermediate layer 25 is interposed between each semiconductor layer structure and the substrate. N-side and p-side electrodes are formed on the lower-surface side of each of the joined semiconductor layer structure 20.

Figure 7A:
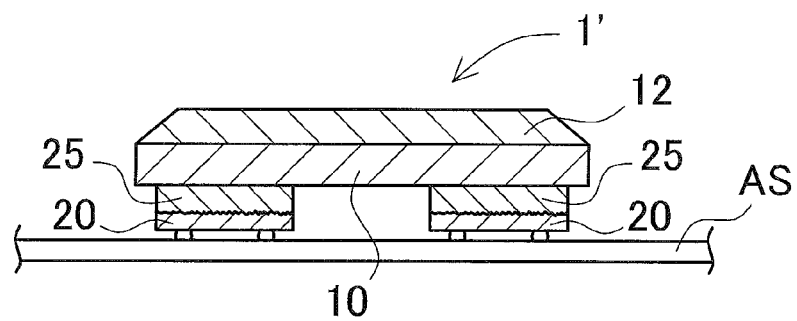
FIGS. 7A to 7D are schematic cross-sectional views showing production processes of the semiconductor light emitting device shown in FIG. 6.

Subsequently, as shown in FIG. 7A, the light emitting element 1' is mounted onto an adhesive sheet AS as the supporting member with the light guiding member 12 being located on the upper side so that the n-side and p-side electrodes contact the adhesive sheet AS.

Figure 7B:
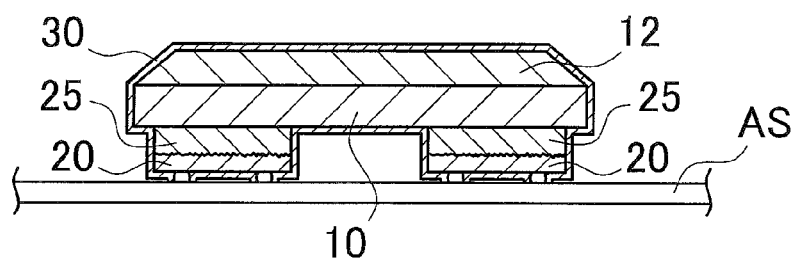
Figure 7C:
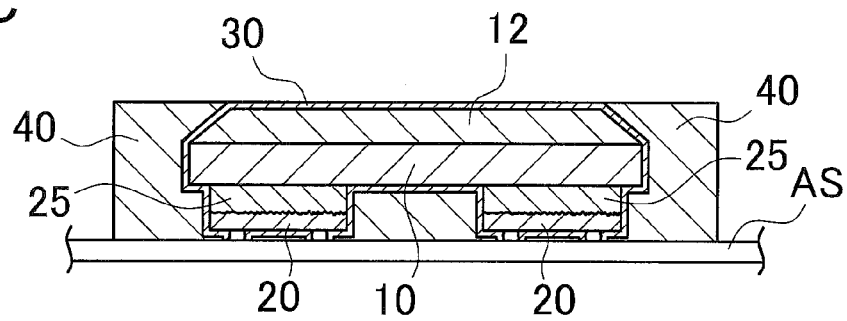

Subsequently, as shown in FIG. 7B, the light reflection layer 30 is formed by atomic layer deposition to continuously cover the surfaces of the light guiding member 12, the substrate 10, the intermediate layers 25 (AlON layer etc.), and the semiconductor layer structures 20. Subsequently, as shown in FIG. 7C, the light reflective covering member 40 is formed so that the space between the adjacent semiconductor layer structures 20 is filled with the covering member. Typical molding process (e.g., compression molding, transfer-molding, and injection molding processes) can be used to form the covering member 40.

Figure 7D:
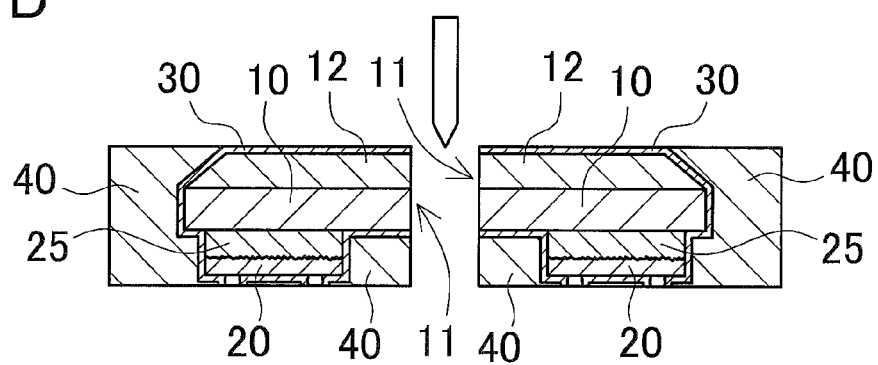

As shown in FIG. 7D, the covering member 40, the light guiding member 12, and the substrate 10 are divided along the line between at least two adjacent semiconductor layer structures 20 so that the light-extracting region 11 is exposed in the end surfaces of the divided light guiding member 12 and growth substrate 10. For example, a wafer dicing process, a diamond wafer cutting process, or the like can be used to divide the covering member 40, the light guiding member 12, and the growth substrate 10. The semiconductor light emitting device as shown in FIG. 6 can be produced by the aforementioned production processes.

Comparative Test

Figure 5:
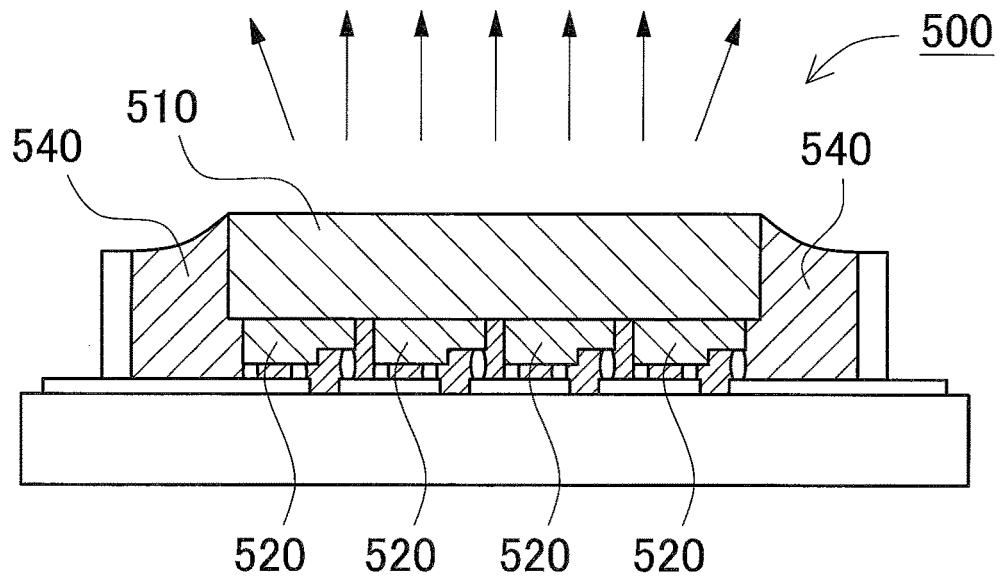
FIG. 5 is a schematic cross-sectional view showing a conventional semiconductor light emitting device.
Figure 8:
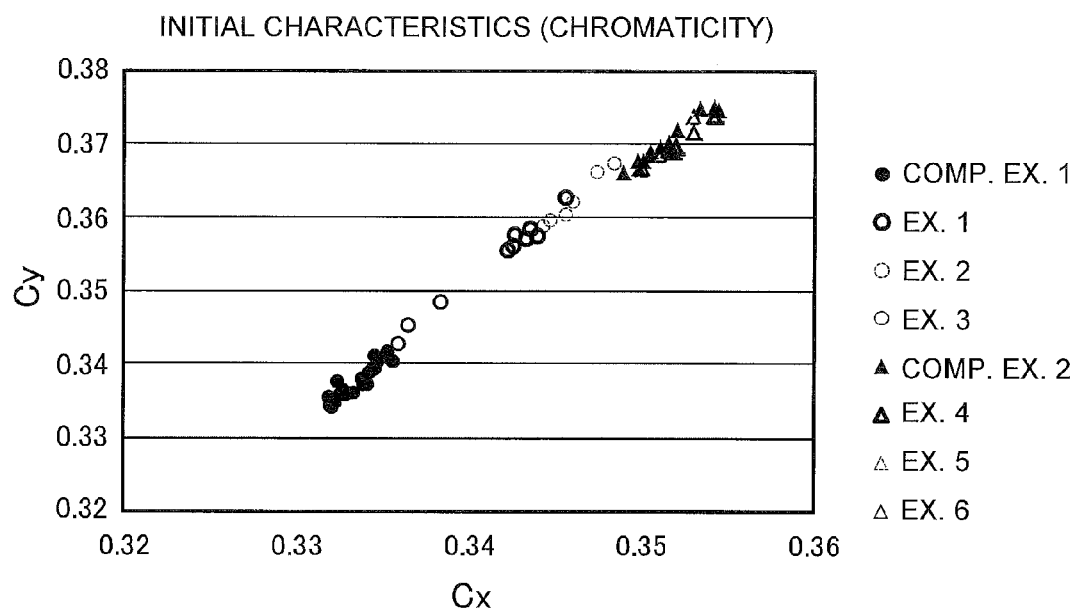
FIG. 8 is a graph showing the measured initial characteristics (chromaticity coordinates) of semiconductor light emitting devices according to examples 1 to 6 and comparative examples 1 to 2.
Figure 9:
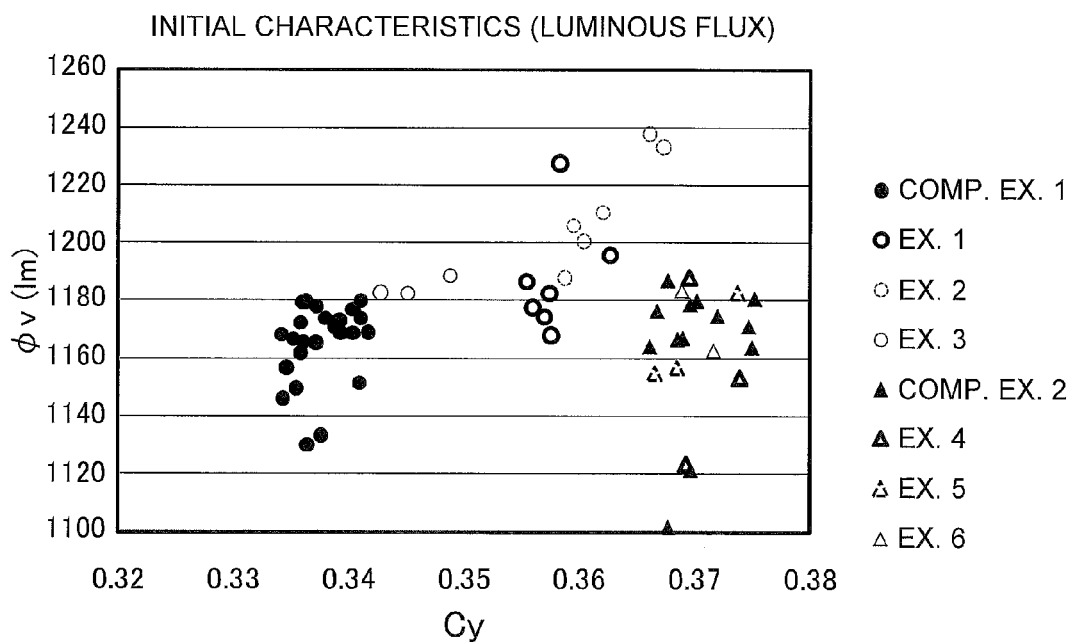
FIG. 9 is a graph showing the measured initial characteristics (luminous flux) of the semiconductor light emitting devices according to examples 1 to 6 and comparative examples 1 to 2.

To test the performance of the light reflection layer according to the first embodiment, the semiconductor light emitting devices shown in FIG. 1 and semiconductor light emitting devices shown in FIG. 5 as comparative examples are produced. FIGS. 8 and 9 are graphs showing the results of measured chromaticity and luminous flux, respectively. In the graphs, the light reflection layer in the light emitting devices according to examples 1 to 6 are constructed of a DBR formed by ALD. Blue LEDs are used as the light emitting elements in the examples and the comparative examples. Specifically, the covering member is not provided in the light emitting devices according to the examples 1 to 3, and the covering member is provided in in the light emitting devices according to the examples 4 to 6. The DBRs as the light reflection layers are designed to reflect light with different target wavelength. More specifically, the DBRs in the examples 1 and 4 are designed to reflect blue light. The DBRs in the examples 2 and 5 are designed to reflect blue light and green light. The DBRs in the examples 3 and 6 are designed to reflect green light. The semiconductor light emitting devices according to the comparative example 1 include blue LEDs, but include neither the light reflection layer nor the covering member. The semiconductor light emitting devices according to the comparative example 2 include the covering member. In FIGS. 8 and 9, circles represent the semiconductor light emitting devices according to the examples 1 to 3 and the comparative example 1, which do not include the covering member, while triangles represent the semiconductor light emitting devices according to the examples 4 to 6 and the comparative example 2, which include the covering member.

It is found from FIG. 8 that the circles (examples 1-3), which represent the semiconductor light emitting devices without the covering member, spread in a wide chromaticity range. However, the circles (examples 1-3) can be closer to the triangles, which represent the chromaticity of the semiconductor light emitting devices with the covering member, than comparative example 1. In addition, it is found from FIG. 9 that the extracting efficiency of the semiconductor light emitting devices without the covering member shown by the circles (examples 1-3) is relatively high as compared with the semiconductor light emitting devices with the covering member shown by the triangles (examples 4-6). In particular, the luminous flux is high in the example 2 in which the DBR for reflecting blue light and the green light. As a result, it is found that the chromaticity of the light emitting device according to the example 2 can be the same degree as the conventional semiconductor light emitting device with the covering member, while the luminous flux of the device according to the example 2 can be improved. Consequently, it is found that the light emitting device without the covering member according to the embodiment can confine light as much as the light emitting device with the covering member, and have an improved luminous flux value. In addition, since the covering resin can be omitted as discussed above, in other words, organic materials such as organic resin can be eliminated so that the light emitting device can be constructed of inorganic materials, the reliability can be improved.

The thickness of the layer can be constant irrespective of position using ALD. As a result, optical multilayer can be evenly formed in all the directions. Therefore, the semiconductor light emitting device with improved optical performance can be provided.

A semiconductor light emitting device and a method for producing a semiconductor light emitting device according to the present invention can be applied to a light source for backlighting, a light source for lighting, a headlight, a display that includes light emitting devices as light sources arranged in a matrix shape, a traffic light, an illuminated switch, various sensors such as image scanner, and various indicators, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A method for producing a semiconductor light emitting device, the method comprising:
   providing a light emitting element that includes a semiconductor layer structure on the lower-surface side of a substrate;
   placing the light emitting element on or above a supporting member so that a semiconductor layer structure side of the light emitting element faces the supporting member; and
   coating the surfaces of the substrate and the semiconductor layer structure with a light reflection layer by using atomic layer deposition so as to expose at least a part of the upper surface or any side surface of the substrate as a light-extracting region, in this order,
   wherein in the providing a light emitting element, a wavelength conversion member is provided in the substrate, and after the semiconductor layer structure is grown on a light-transmissive growth substrate the growth substrate is joined to the substrate with the growth substrate facing the substrate, when the light emitting device is prepared.

2. The method for producing a semiconductor light emitting device according to claim 1, wherein in the coating the surfaces of the substrate and the semiconductor layer structure, a mask is formed on or above the at least a part of the upper surface or any side surface of the substrate, and the mask is removed after the surfaces of the substrate and the semiconductor layer structure are coated with the light reflection layer by using atomic layer deposition.

3. The method for producing a semiconductor light emitting device according to claim 1, wherein in the coating the surfaces of the substrate and the semiconductor layer structure, the light-extracting region is exposed by dividing the substrate after the surfaces of the substrate and the semiconductor layer structure are coated with the light reflection layer by using atomic layer deposition.

4. The method for producing a semiconductor light emitting device according to claim 1, wherein in the placing the light emitting element, an electrode layer is provided on or above the upper surface of the supporting member, and the semiconductor layer structure is electrically connected to the electrode layer,
   wherein in the coating the surfaces of the substrate and the semiconductor layer structure, the light reflection layer covers the upper surface of the supporting member together with the surfaces of the substrate and the semiconductor layer.

5. The method for producing a semiconductor light emitting device according to claim 1, wherein the light reflection layer is a dielectric multilayer.

6. The method for producing a semiconductor light emitting device according to claim 5, wherein the dielectric multilayer is constructed of at least two types of layers selected from the group consisting of $SiO_2$, $TiO_2$, $Nb_2O_5$, $ZrO_2$, $Al_2O_3$, $Ta_2O_5$, $MgF_2$, AlN, SiON, and SiN.

7. The method for producing a semiconductor light emitting device according to claim 1, wherein the light reflection layer includes a dielectric multilayer, and a metal layer that is arranged on or above the dielectric multilayer.

8. The method for producing a semiconductor light emitting device according to claim 1, wherein in the providing a light emitting element, the width of the substrate, is greater than the width of the semiconductor layer structure of the light emitting element.

9. The method for producing a semiconductor light emitting device according to claim 1, wherein in the providing a light emitting element, the semiconductor layer is joined to the substrate by direct bonding when the light emitting device is prepared.

10. The method for producing a semiconductor light emitting device according to claim 1, wherein the thickness of the substrate is greater than the thickness of the growth substrate.

11. The light emitting device according to claim 10, wherein the light reflection layer continuously covers the surfaces of the substrate and the semiconductor layer structure so as to expose the any side surface of the substrate as the light-extracting region,
   wherein a light reflective covering member is provided which covers at least the part of the light reflection layer that covers the side surface of the substrate.

12. A semiconductor light emitting device comprising:
   a substrate;
   a semiconductor layer structure that is optically connected to the lower surface of the substrate;
   a light reflection layer that continuously covers the surfaces of the substrate and the semiconductor layer structure so as to expose at least a part of the upper surface or any side surface of the substrate as a light-extracting region; and
   a light-transmissive growth substrate that is interposed between the substrate and the semiconductor layer structure,
   wherein the light reflection layer is constructed of a plurality of layers, and the light reflection layer has a substantially even thickness, and
   wherein the substrate contains a wavelength conversion member.

13. The light emitting device according to claim 12, wherein the substrate is joined to the growth substrate by direct bonding.

14. The light emitting device according to claim 12, wherein the light reflection layer contains a carbon component.

15. The light emitting device according to claim 12 further comprising a supporting member that includes an electrode layer on or above the upper surface of the supporting member,
   wherein the semiconductor layer structure is electrically connected to the electrode layer,
   wherein the light reflection layer continuously covers the upper surface of the supporting member together with the surfaces of the substrate and the semiconductor layer structure so as to expose the at least a part of the upper surface of the substrate as the light-extracting region.

16. The light emitting device according to claim 12, wherein the light reflection layer is formed by atomic layer deposition.

17. The light emitting device according to claim 12, wherein the light reflection layer is a dielectric multilayer.

18. The light emitting device according to claim 12, wherein the light reflection layer includes a dielectric multilayer, and a metal layer that is arranged on or above the dielectric multilayer.

* * * * *